US010115626B1

(12) United States Patent
Chen

(10) Patent No.: US 10,115,626 B1
(45) Date of Patent: Oct. 30, 2018

(54) METHODS FOR FORMING ISOLATION BLOCKS OF SEMICONDUCTOR DEVICES, SEMICONDUCTOR DEVICES AND METHODS FOR MANUFACTURING THE SAME

(71) Applicant: Vanguard International Semiconductor Corporation, Hsinchu (TW)

(72) Inventor: Li-Che Chen, Hsinchu (TW)

(73) Assignee: VANGUARD INTERNATIONAL SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 15/651,114

(22) Filed: Jul. 17, 2017

(51) Int. Cl.
H01L 21/76 (2006.01)
H01L 21/762 (2006.01)
H01L 21/822 (2006.01)
H01L 21/324 (2006.01)
H01L 21/84 (2006.01)

(52) U.S. Cl.
CPC .... H01L 21/76229 (2013.01); H01L 21/3247 (2013.01); H01L 21/76264 (2013.01); H01L 21/822 (2013.01); H01L 21/84 (2013.01)

(58) Field of Classification Search
None
See application file for complete search history.

(56) References Cited

U.S. PATENT DOCUMENTS 7,829,429 B1 * 11/2010 Printy ................. H01L 27/1207 257/506
9,660,073 B1 * 5/2017 Lin ..................... H01L 29/7816

2001/0048122 A1   12/2001   Tada et al.
2002/0164867 A1   11/2002   Joaquim et al.
2009/0148999 A1    6/2009   Gogoi
2009/0174040 A1    7/2009   Gogoi et al.
2016/0293694 A1   10/2016   Su et al.

FOREIGN PATENT DOCUMENTS

| TW | 391050 B | 5/2000 |
| TW | 502290 B | 9/2002 |
| TW | 201436169 A | 9/2014 |
| TW | 201533905 A | 9/2015 |

OTHER PUBLICATIONS

Taiwanese Office Action and Search Report for Application No. 106118069, dated Feb. 6, 2018.

* cited by examiner

*Primary Examiner* — Thien F Tran

(74) *Attorney, Agent, or Firm* — Birch, Stewart, Kolasch & Birch, LLP

(57) ABSTRACT

A method for forming an isolation block of a semiconductor device includes providing a semiconductor substrate, performing an etching process to form a plurality of trenches which are parallel to each other in the semiconductor substrate, wherein a plurality of strip structures are between the trenches. The strip structures and the trenches occupy a first region in the semiconductor substrate, and the strip structures are arranged staggered with the trenches. The method further includes performing a thermal oxidation process, such that the strip structures are oxidized to form a plurality of oxidized portions, wherein the oxidized portions extended into the trenches and connected to each other to form an isolation block in the semiconductor substrate.

17 Claims, 10 Drawing Sheets

METHODS FOR FORMING ISOLATION BLOCKS OF SEMICONDUCTOR DEVICES, SEMICONDUCTOR DEVICES AND METHODS FOR MANUFACTURING THE SAME

BACKGROUND

Field of the Invention

The invention relates to semiconductor devices, and in particular to an isolation block of a semiconductor device and methods for forming the same.

Description of the Related Art

Semiconductor integrated circuit (IC) industry has been developed rapidly during the past decades. The circuits have been continuously scaled down and become more and more complicate because of the huge progress in semiconductor materials and design technology, especially for elements in high-voltage applications.

The high-voltage elements need to be separated by a certain distance with an isolation block therebetween so the electrical signals can be transmitted without being affected by the high voltages. Since the overall size of the component is limited by the distance, how to utilize the space efficiently by circuit arrangement is a big issue, whereas the cost of semiconductor process will be relatively increased. To shrink the size of the elements and reduce the cost of process at the same time, the semiconductor integrated circuit industry has been constantly improved in terms of the design of materials and manufacturing processes. However, the existing semiconductor integrated devices have not been entirely satisfactory in all respects.

Therefore, up to the present, there are still some problems that can be improved in the manufacturing technology of the semiconductor integrated circuit industry.

BRIEF SUMMARY

Some embodiments of the disclosure form a plurality of trenches and strip structures which are parallel to each other and staggered arranged in the semiconductor substrate by an etching process. Then, by performing a thermal oxidation process, the strip structures are oxidized to form a plurality of oxidized portions, and the oxidized portions are connected to each other and filled up the trenches, thereby an isolation block is formed in the semiconductor substrate. Since the stress is evenly distributed in the isolation block, the problem of wafer warpage caused by uneven stress distribution can be prevented.

In addition, some embodiments of the disclosure efficiently form an isolation block covers a wide range of areas in the semiconductor substrate by etching and thermal oxidation processes, so that the circuit arrangement of the high-voltage elements can be more flexible, and the cost of processing the semiconductor devices can be reduced.

Some embodiments of the disclosure provide a method for forming an isolation block of a semiconductor device. The method includes providing a semiconductor substrate, and performing an etching process to form a plurality of trenches which are parallel to each other in the semiconductor substrate, wherein a plurality of strip structures are between the trenches, the strip structures and the trenches occupy a first region in the semiconductor substrate, and the strip structures are arranged staggered with the trenches. The method also includes performing a thermal oxidation process, such that the strip structures are oxidized to form a plurality of oxidized portions, wherein the oxidized portions extend into the trenches and are connected to each other to form an isolation block in the semiconductor substrate.

Some embodiments of the disclosure provide a method for forming a semiconductor device having a high-voltage isolation block. The method includes providing a semiconductor substrate, and forming a high-voltage isolation block in the semiconductor substrate. The method also includes forming a first metal block and a fourth metal block on the semiconductor substrate, wherein the first metal block is a conductive pad of a first high-voltage element, and the fourth metal block is a conductive pad of a second high-voltage element. The method further includes forming a second metal block and a third metal block on the high-voltage isolation block, wherein the first metal block, the second metal block, the third metal block and the fourth metal block are formed by the same metal layer. In addition, the method includes forming an interconnect structure on the first metal block, the second metal block, the third metal block and the fourth metal block, wherein the first metal block is electrically connected to the second metal block by the interconnect structure, and the third metal block is electrically connected to the fourth metal block by the interconnect structure.

In some embodiments, the foregoing method for forming the high-voltage isolation block includes performing an etching process to form a plurality of trenches which are parallel to each other in the semiconductor substrate, wherein a plurality of strip structures are between the trenches, the strip structures and the trenches occupy a first region in the semiconductor substrate, and the strip structures are arranged staggered with the trenches. The foregoing method for forming the high-voltage isolation block also includes performing a thermal oxidation process, such that the strip structures are oxidized to form a plurality of oxidized portions, wherein the oxidized portions extend into the trenches and are connected to each other to form the high-voltage isolation block in the semiconductor substrate.

Some embodiments of the disclosure provide a semiconductor device having a high-voltage isolation block. The semiconductor device includes a semiconductor substrate having the high-voltage isolation block, and a first metal block and a fourth metal block disposed on the semiconductor substrate, wherein the first metal block is a conductive pad of a first high-voltage element, and the fourth metal block is a conductive pad of a second high-voltage element. The semiconductor device also includes a second metal block and a third metal block disposed on the high-voltage isolation block, wherein the first metal block, the second metal block, the third metal block and the fourth metal block belong to the same metal layer. The semiconductor device further includes an interconnect structure disposed on the first metal block, the second metal block, the third metal block and the fourth metal block, wherein the first metal block is electrically connected to the second metal block by the interconnect structure, and the third metal block is electrically connected to the fourth metal block by the interconnect structure.

A detailed description is given in the following embodiments with reference to the accompanying drawings.

BRIEF DESCRIPTION OF THE DRAWINGS

The disclosure can be more fully understood from the following detailed description when read with the accompanying figures. It is worth noting that, in accordance with the standard practice in the industry, various features are not drawn to scale. In fact, the dimensions of the various features may be arbitrarily increased or reduced for clarity of discussion.

FIGS. 1A-1E are respective exemplary cross-sectional views along line 1-1' of FIGS. 2A-2E.

FIGS. 3A-3C are respective exemplary cross-sectional views along line 3-3' of FIGS. 4A-4C.

DETAILED DESCRIPTION OF THE INVENTION

Figure 1A:
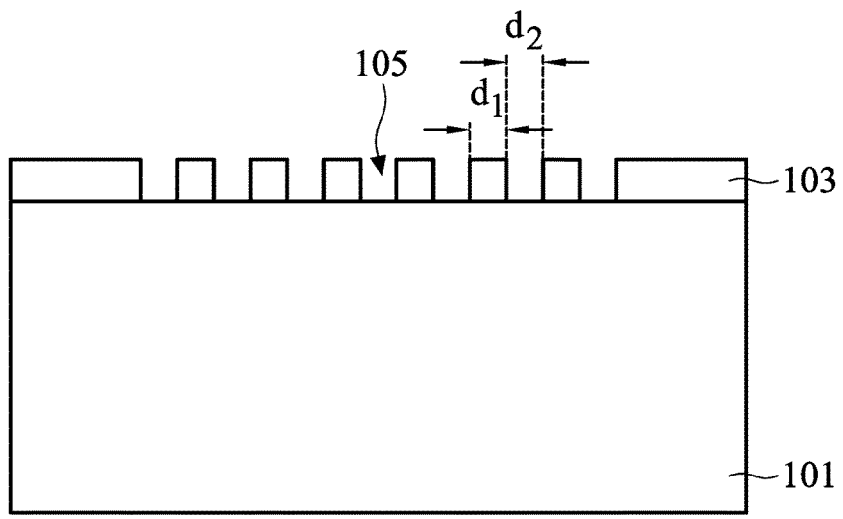
FIGS. 1A to 1E are cross-sectional views illustrating an exemplary sequential forming process of a semiconductor device in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first component over or on a second component in the description that follows may include embodiments in which the first and second components are formed in direct contact, and may also include embodiments in which additional components may be formed between the first and second components, such that the first and second components may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some embodiments are described below. Throughout the various views and illustrative embodiments, like reference numbers are used to designate like elements. It should be understood that additional operations can be provided before, during, and after the method, and some of the operations described can be replaced or eliminated for other embodiments of the method.

Some embodiments of the disclosure provide a method for forming an isolation block of a semiconductor device. FIGS. 1A to 1E are cross-sectional views illustrating an exemplary sequential forming process of a semiconductor device 100 and its isolation block in accordance with some embodiments. FIGS. 2A to 2E are top views illustrating an exemplary sequential forming process of the semiconductor device 100 in accordance with some embodiments. FIGS. 1A-1E are respective exemplary cross-sectional views along line 1-1' of FIGS. 2A-2E As shown in FIG. 1A, a semiconductor substrate 101 is provided. In accordance with some embodiments, the semiconductor substrate 101 may be made of silicon or another semiconductor material. Alternatively, the semiconductor substrate 101 may include other elementary semiconductor materials such as germanium. In some embodiments, the semiconductor substrate 101 is made of a compound semiconductor such as silicon carbide, gallium nitride, gallium arsenic, indium arsenide, or indium phosphide. In some embodiments, the semiconductor substrate 101 is made of an alloy semiconductor such as silicon germanium, silicon germanium carbide, gallium arsenic phosphide, or gallium indium phosphide. In some embodiments, the semiconductor substrate 101 includes a silicon-on-insulator (SOI) substrate.

Figure 2A:
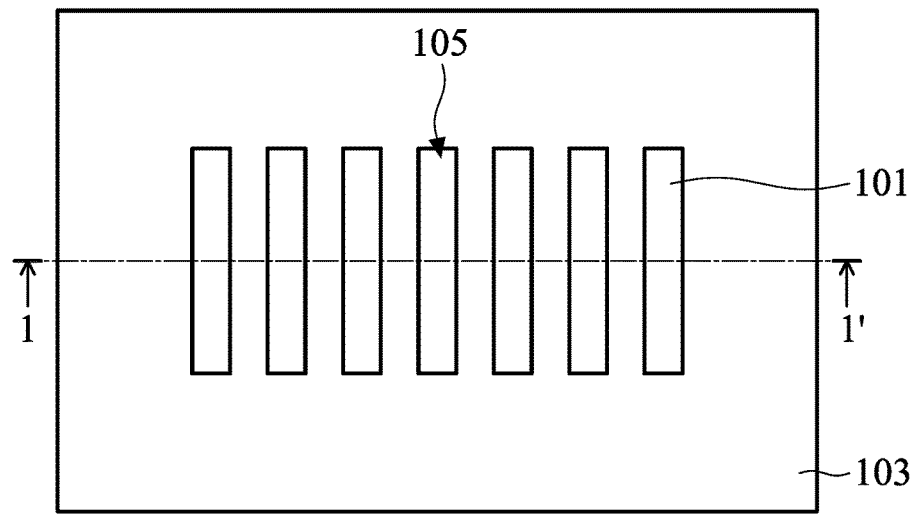
FIGS. 2A to 2E are top views illustrating an exemplary sequential forming process of a semiconductor device in accordance with some embodiments.

As shown in FIGS. 1A and 2A, a patterned mask 103 is formed on the semiconductor substrate 101. The patterned mask 103 has a plurality of openings 105 which are parallel to each other, and portions of the semiconductor substrate 101 are exposed by the foregoing openings 105. The distance between one of the openings 105 and another adjacent opening 105 is defined as a first distance d1, and one of the openings 105 has a width which defined as a second distance d2.

In the present embodiment, the first distance d1 is equal to the second distance d2. This is an efficient arrangement for the process. However, the first distance d1 is not limited to be equal to the second distance d2. In other embodiments, the first distance d1 may be more or less than the second distance d2. Possible arrangements and the corresponding effects are described below.

Moreover, the patterned mask 103 may be formed by using a thermal oxidation process, a chemical vapor deposition (CVD) process, a high density plasma chemical vapor deposition (HDPCVD) process, an atomic layer deposition (ALD) process, a spin coating process, a sputtering process, a metal organic chemical vapor deposition (MOCVD) process, or a combination thereof to form a mask material layer (not shown), and the mask material layer is patterned to form a patterned mask 103 by a patterning process, such as a photolithography process and an etching process. In some embodiments, the patterned mask 103 may be a single-layer or a multiple-layer structure. For example, the patterned mask 103 may be made of silicon nitride (SiN), silicon dioxide ($SiO_2$), silicon oxynitride (SiON), tetraethoxysilane (TEOS), or a combination thereof.

Figure 1B:
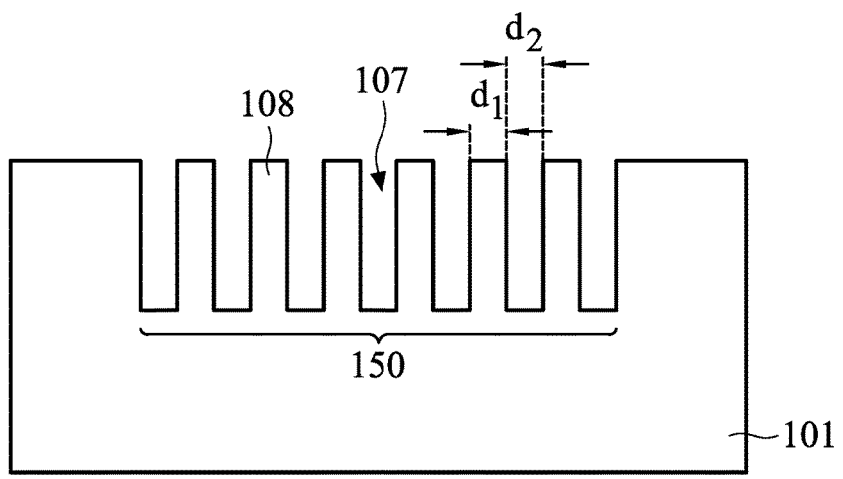
Figure 2B:
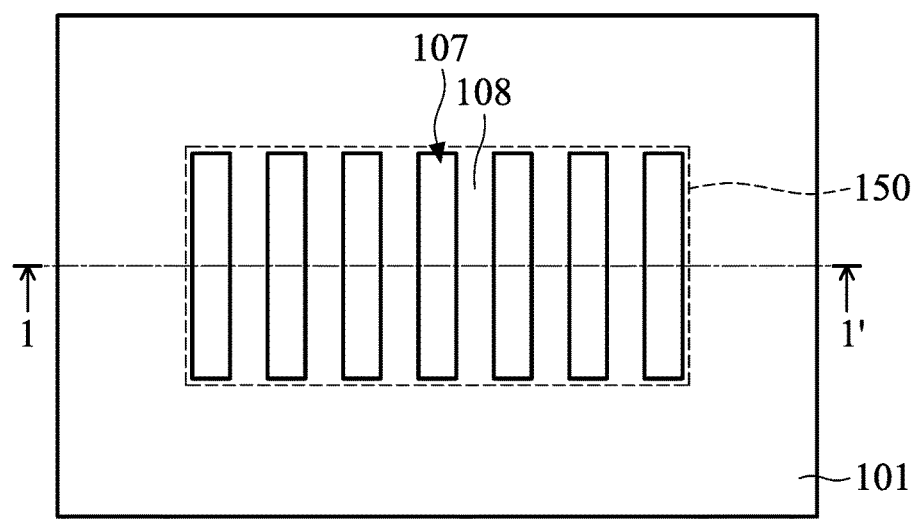

As shown in FIGS. 1B and 2B, in accordance with some embodiments, an etching process is performed on the semiconductor substrate 101 by using the patterned mask 103 as a mask to transfer the pattern of the patterned mask 103 into the semiconductor substrate 101, so that a plurality of trenches 107 and strip structures 108 which are parallel to each other are formed in the semiconductor substrate 101, and the strip structures 108 are arranged staggered with the trenches 107.

In some embodiments, the depth of the trenches 107 is in a range from about 5 μm to about 100 In particular, the depth of the trenches 107 is in a range from about 30 μm to about 100 The depth of the trenches 107 can be adjusted according to the requirements of the process. In other embodiments, the trenches 107 may be trenches penetrating through the semiconductor substrate 101.

Specifically, a plurality of trenches which are parallel to each other and a plurality of strip structures 108 between the trenches 107 are formed in the semiconductor substrate 101 by an etching process. A first region 150 in the semiconductor substrate 101 is occupied by the foregoing trenches 107 and the strip structures 108. The position of the first region 150 is the position which an isolation block will be formed in the subsequently processes.

Similar to FIG. 1A, the distance between one of the trenches 107 and another adjacent trench 107 is about the same as the first distance d1, and the width of one of the trenches 107 is about the same as the second distance d2. In the present embodiment, the first distance d1 is equal to the second distance d2. In addition, in some embodiments, the etching process may include a dry etching process, a wet etching process, or a combination thereof.

Figure 1C:
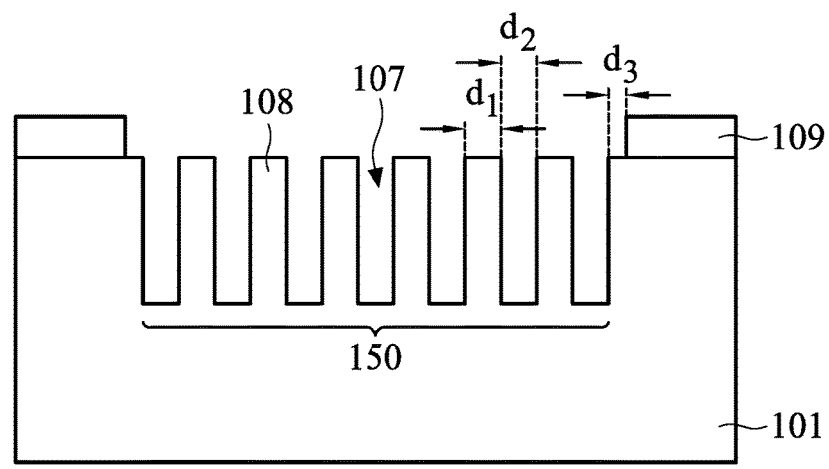
Figure 2C:
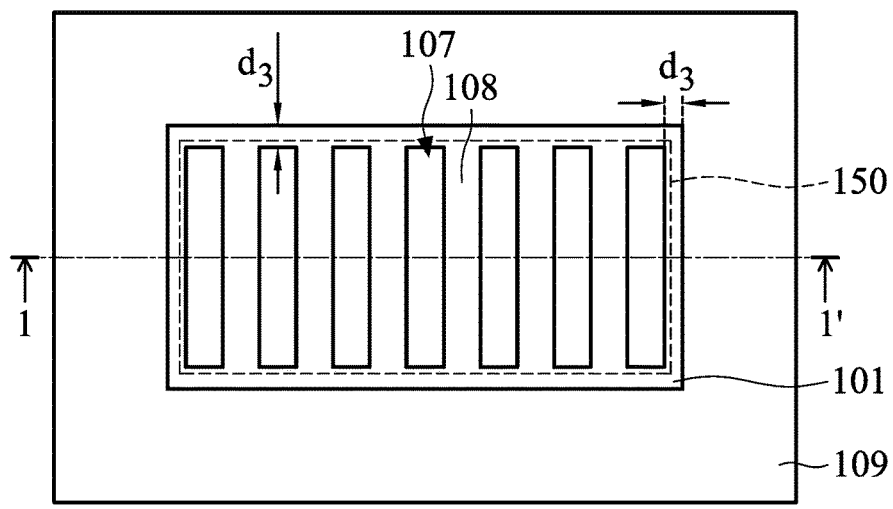

As shown in FIGS. 1C and 2C, in accordance with some embodiments, a shielding layer 109 having an opening is formed on the semiconductor substrate 101. It should be noted that, in the top view of FIG. 2C, the first region 150 and a portion of the semiconductor substrate 101 peripheral to the first region 150 are exposed by the opening of the shielding layer 109. Specifically, the sidewall of the shielding layer 109 is not aligned with the outmost sidewall of the trenches 107 in the first region 150 of the semiconductor substrate 101, and the sidewall of the shielding layer 109 and the outmost sidewall of the trenches 107 in the semiconductor substrate 101 are separated by a third distance d3. In some embodiments, the shielding layer 109 is used for defining the actual position of the isolation block. In the subsequent processes, the region of the semiconductor substrate 101 not covered by the shielding layer 109 is the position of the isolation block which will be formed subsequently.

In some embodiments, the shielding layer 109 may include silicon oxide, silicon nitride or silicon oxynitride, and the shielding layer 109 is formed by a chemical vapor deposition (CVD) process, a physical vapor deposition (PVD) process, a high density plasma chemical vapor deposition (HDPCVD), an atomic layer deposition (ALD) process, a spin coating process, or a combination thereof. Moreover, the opening of the shielding layer 109 is formed by a patterning process, such as a photolithography process and an etching process.

Figure 1D:
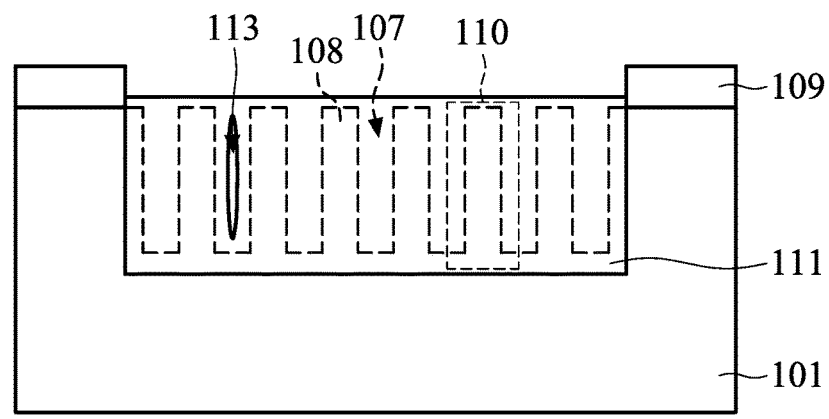
Figure 2D:
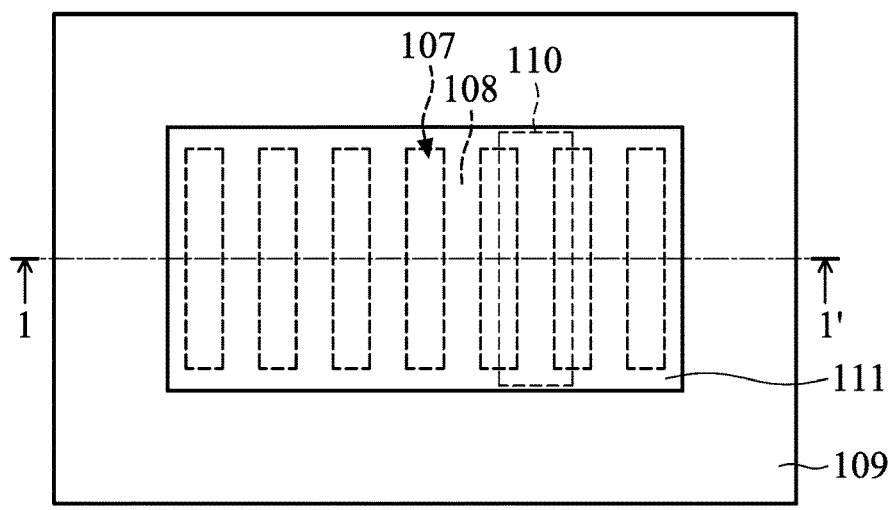

As shown in FIGS. 1D and 2D, in accordance with some embodiments, a thermal oxidation process is performed so that the strip structures 108 between the trenches 107 are oxidized to form a plurality of oxidized portions 110. It should be noted that, there is only one of the oxidized portions 110 shown in FIG. 1D. However, the actual number of the oxidized portions 110 is not limited to one. These oxidized portions 110 are formed from the strip structures 108 and extend into the trenches 107 and are further connected to each other so that a complete isolation block 111 is formed in the semiconductor substrate 101. In the present embodiment, in addition to the strip structures 108 between the trenches 107, the common sidewall portion of the semiconductor substrate 101 and the trenches 107 (i.e., the portion of the semiconductor substrate 101 at the edge of the first region 150) and the bottom portion of the trenches 107 are also oxidized by the thermal oxidation process.

In some embodiments, the temperature of the thermal oxidation process is in a range from about 800° C. to about 1200° C. Specifically, in the thermal oxidation process, about at least two units of silicon oxide are produced by consuming a single unit of silicon. Therefore, the volume of one of the oxidized portions 110 formed by oxidizing the strip structures 108 is more than twice the volume of one of the strip structures 108. As shown in FIGS. 1D and 2D, the dashed lines represent the original positions of the strip structures 108 and the trenches 107. To sum up, the area and the volume of the isolation block 111 formed by performing the thermal oxidation process are greater than the area and the volume of the first region 150, and the top surface of the isolation block 111 is higher than the top surface of the semiconductor substrate 101.

In some embodiments, since some oxidized portions 110 are not completely connected to adjacent oxidized portions 110, a void 113 may be formed in the isolation block 111, as shown in FIGS. 1D and 2D. In some embodiments, the void 113 does not extend to the top surface of the semiconductor substrate 101. Therefore, the isolation effect of the isolation block 111 and its capability of enduring high-voltage are not weakened by the void 113. In addition, in other embodiments, adjacent oxidized portions 110 are completely connected to each other, so there is no void 113 formed therein.

Moreover, as shown in FIGS. 1C and 1D, if the second distance d2 is smaller than the first distance d1 before performing the thermal oxidation process, that is, the openings 105 and the trenches 107 have high aspect ratios, the time required for forming the openings 105 and the trenches 107 by etching may be much longer. However, only a short time is required for forming the isolation block 111 by the thermal oxidation process since the distance between each two adjacent strip structures 108 is shorter. On the contrary, if the second distance d2 is greater than the first distance d1, that is, the distance between two adjacent strip structures 108 is greater, the time required for forming the isolation block 111 with a thermal oxidation process may be much longer. However, the time required for forming the openings 105 and the trenches 107 by etching may be shorter since the openings 105 and the trenches 107 have small aspect ratios. In some embodiments, at least two units of silicon oxide are produced by consuming a single unit of silicon in the thermal oxidation process. Therefore, the first distance d1 being equal to the second distance d2 is an efficient arrangement for the process.

Figure 1E:
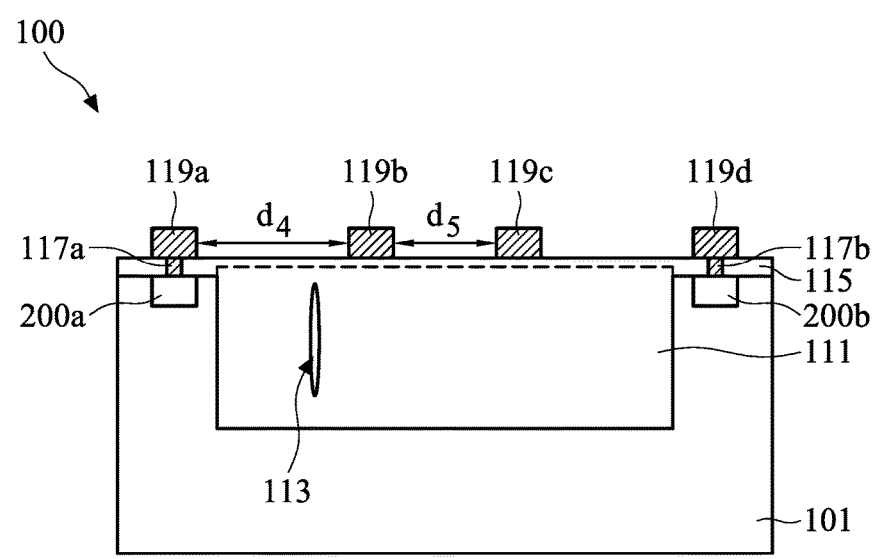
Figure 2E:
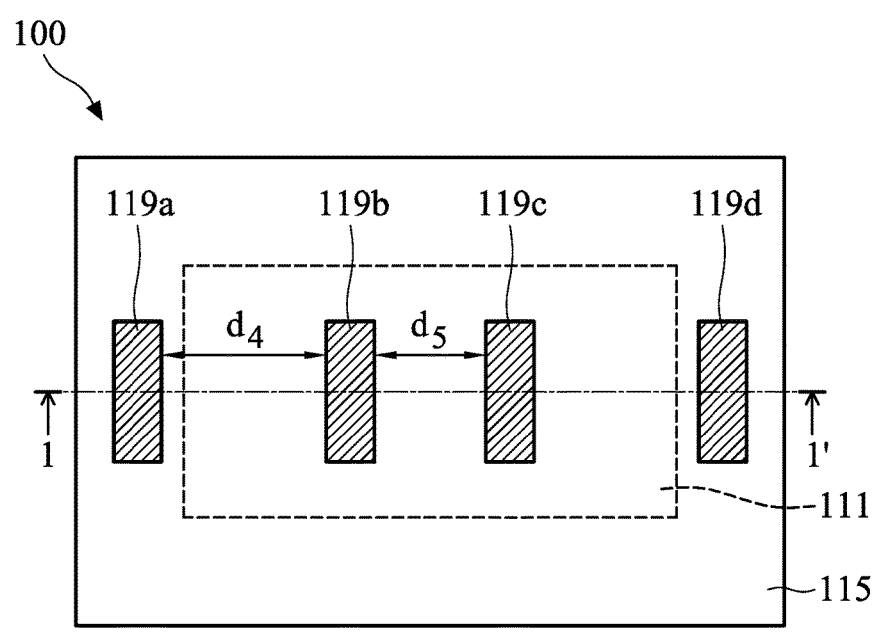

As shown in FIGS. 1E and 2E, in accordance with some embodiments, an oxide layer 115 is formed on the semiconductor substrate 101 and the isolation block 111 after removing the shielding layer 109. In some embodiments, the shielding layer 109 may be removed by an etching process. In addition, the oxide layer 115 may be formed by a chemical vapor deposition (CVD) process, a physical vapor deposition (PVD) process, a high density plasma chemical vapor deposition (HDPCVD), an atomic layer deposition (ALD) process, a spin coating process, or a combination thereof. In some embodiments, a planarization process is performed on the oxide layer 115 such that the oxide layer 115 can have a planar top surface. The planarization process includes a chemical mechanical polishing (CMP) process, a grinding process, an etching process, another applicable process or a combination thereof.

Next, a first via 117a and a second via 117b are formed in the oxide layer 115 on the semiconductor substrate 101. The first via 117a is disposed on a first high-voltage element 200a in the semiconductor substrate 101, and the second via 117b is disposed on a second high-voltage element 200b in the semiconductor substrate 101. Then, a first metal block 119a, a second metal block 119b, a third metal block 119c and a fourth metal block 119d are formed on the oxide layer 115.

In some embodiments, the first metal block 119a, the second metal block 119b, the third metal block 119c and the fourth metal block 119d are formed simultaneously by performing a patterning process on the same metal layer (not shown), and the first metal block 119a, the second metal block 119b, the third metal block 119c and the fourth metal block 119d are four conductive pads which belong to the same layer.

It should be noted that, the first metal block 119a is disposed on the first high-voltage element 200a, and the first metal block 119a is electrically connected to the first high-voltage element 200a through the first via 117a. Moreover, the fourth metal block 119d is disposed on the second high-voltage element 200b, and the fourth metal block 119d is electrically connected to the second high-voltage element 200b through the second via 117b. In addition, the second metal block 119b and the third metal block 119c are disposed on the isolation block 111.

As shown in FIGS. 1E and 2E, the distance between the first metal block 119a and the second metal block 119b is defined as a fourth distance d4, and the distance between the second metal block 119b and the third metal block 119c is defined as a fifth distance d5. In some embodiments, the fourth distance d4 and the fifth distance d5 are at least 30 µm. The larger the fourth distance d4 and the fifth distance d5, the higher voltage the isolation block 111 can endure. Therefore, the fourth distance d4 and the fifth distance d5 may be adjusted according to actual application.

Figure 3A:
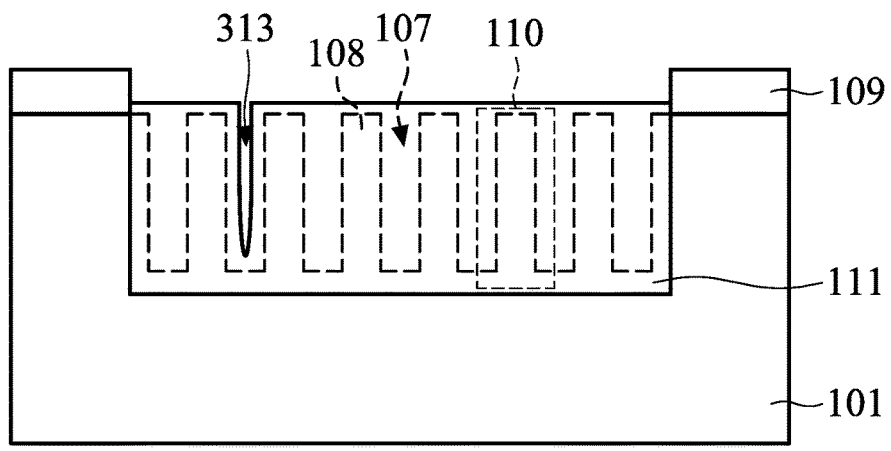
FIGS. 3A to 3C are cross-sectional views illustrating an exemplary sequential forming process of a semiconductor device in accordance with other embodiments.
Figure 3B:
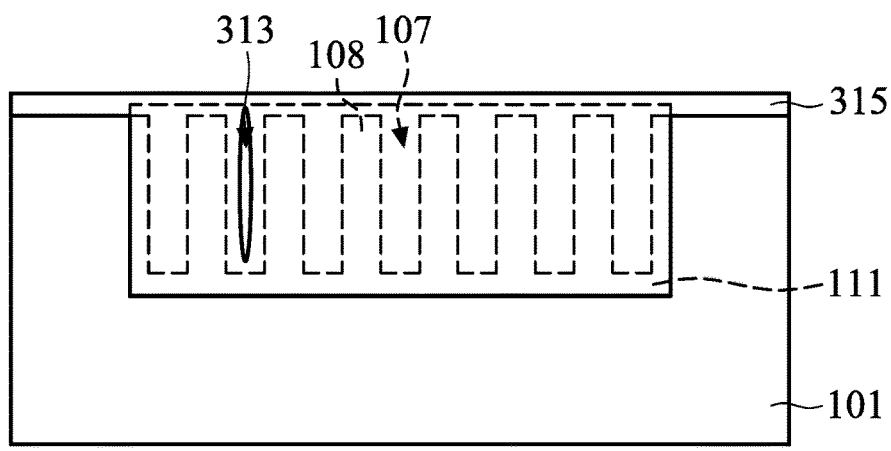
Figure 3C:
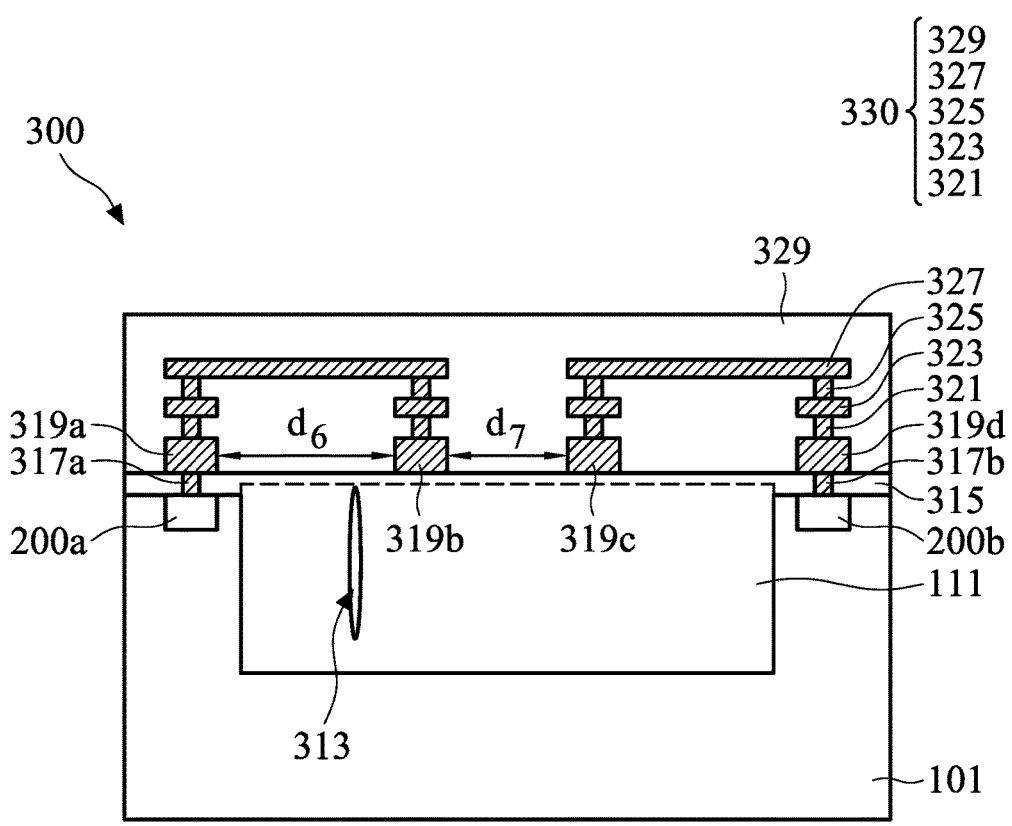
Figure 4A:
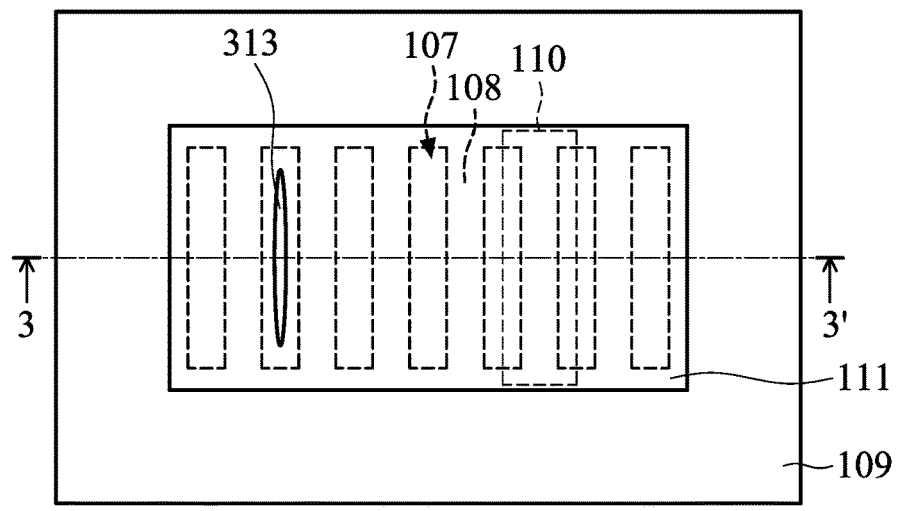
FIGS. 4A to 4C are top views illustrating an exemplary sequential forming process of a semiconductor device in accordance with other embodiments.
Figure 4B:
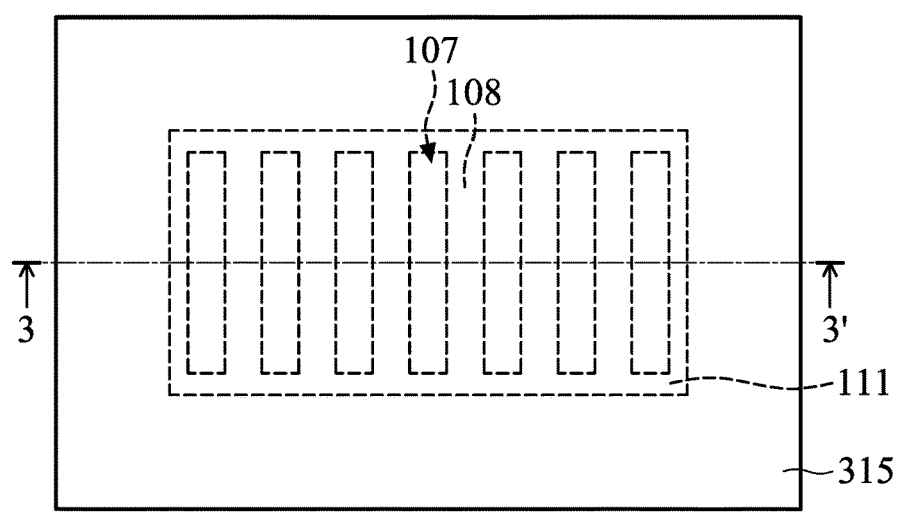
Figure 4C:
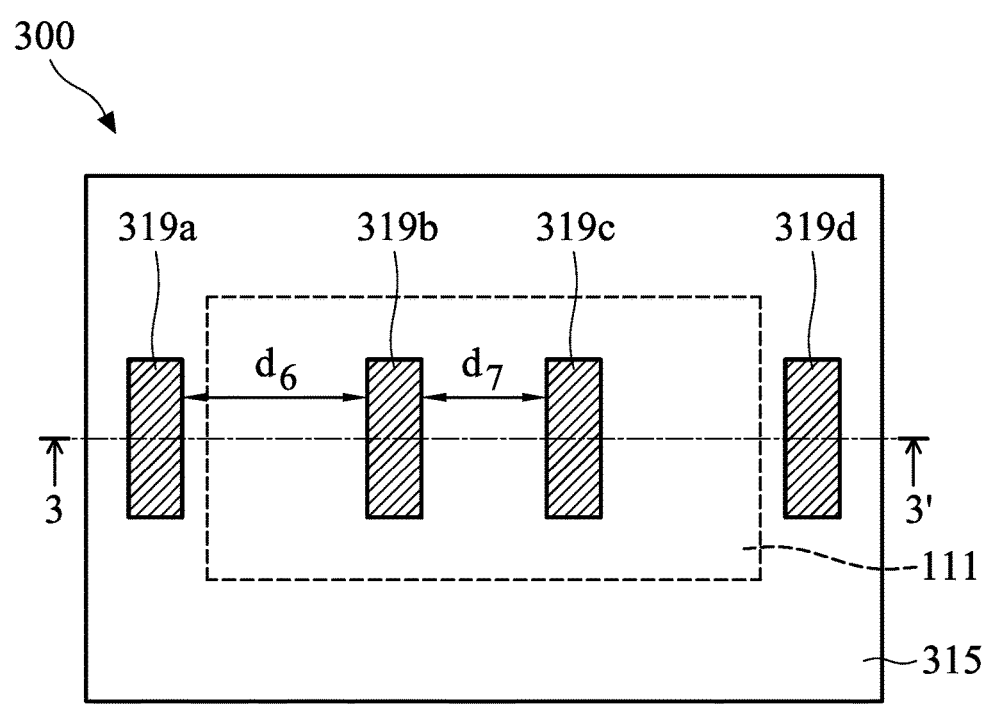

FIGS. 3A to 3C are cross-sectional views illustrating an exemplary sequential forming process of a semiconductor device 300 and its isolation block in accordance with other embodiments. FIGS. 4A to 4C are top views illustrating an exemplary sequential forming process of the semiconductor device 300 in accordance with other embodiments. FIGS. 3A-3C are respective exemplary cross-sectional views along line 3-3' of FIGS. 4A-4C.

As shown in FIGS. 3A and 4A, in accordance with other embodiments, a void 313 is formed in the isolation block 111 after performing the thermal oxidation process, which is similar to FIG. 1D. The void 313 is formed extending to the top surface of the isolation block 111. In some other embodiments, the number of the void 313 is not limited to one, and the bottom portion of one of the voids 313 extend downward, and a portion of the semiconductor substrate 101 is exposed, that is, the isolation block 111 has a void 313 therein, and the oxidized portions 110 on both sides of the void 313 are not completely connected to each other.

In order to form a complete isolation block 111, as shown in FIGS. 3B and 3C, an oxide layer 315 is formed on the semiconductor substrate 101 and the isolation block 111 after removing the shielding layer 109 to seal the void 313. Moreover, a planarization process is performed on the oxide layer 315, such that the oxide layer 315 can have a planar top surface. It should be noted that, the void 313 is not exposed by the planarization process. Some processes used to form the oxide layer 315 are similar to, or the same as, those used to form the oxide layer 115, so the descriptions thereof are not repeated herein.

Next, as shown in FIGS. 3C and 4C, a first via 317a and a second via 317b are formed in the oxide layer 315 on the semiconductor substrate 101. The first via 317a is disposed on the first high-voltage element 200a in the semiconductor substrate 101, and the second via 317b is disposed on the second high-voltage element 200b in the semiconductor substrate 101. Then, a first metal block 319a, a second metal block 319b, a third metal block 319c and a fourth metal block 319d are formed on the oxide layer 315.

In some embodiments, the first metal block 319a, the second metal block 319b, the third metal block 319c and the fourth metal block 319d are formed simultaneously by performing a patterning process on the same metal layer (not shown), and the first metal block 319a, the second metal block 319b, the third metal block 319c and the fourth metal block 319d are four conductive pads which belong to the same layer.

It should be noted that, the first metal block 319a is disposed on the first high-voltage element 200a, and the first metal block 319a is electrically connected to the first high-voltage element 200a through the first via 317a. Moreover, the fourth metal block 319d is disposed on the second high-voltage element 200b, and the fourth metal block 319d is electrically connected to the second high-voltage element 200b through the second via 317b. In addition, the second metal block 319b and the third metal block 319c are disposed on the isolation block 111.

Still referring to FIGS. 3C and 4C, the distance between the first metal block 319a and the second metal block 319b is defined as a sixth distance d6, and the distance between the second metal block 319b and the third metal block 319c is defined as a seventh distance d7. In some embodiments, the sixth distance d6 and the seventh distance d7 are at least 30 µm. The larger the sixth distance d6 and the seventh distance d7, the higher voltage the isolation block 111 can endure. Therefore, the sixth distance d6 and the seventh distance d7 may be adjusted according to actual application.

Then, as shown in FIGS. 3C and 4C, an interconnect structure 330 is formed on the first metal block 319a, the second metal block 319b, the third metal block 319c and the fourth metal block 319d. The interconnect structure 330 includes multiple vias 321 and 325, multiple metal layers 323 and 327, and multiple inter-layer dielectric (ILD) layers 329.

In some embodiments, the vias 321, 325 and the metal layers 323, 327 include metals or other applicable conductive materials, for example, tungsten (W), copper (Cu), nickel (Ni), aluminum (Al), tungsten silicide (WSix), polysilicon or a combination thereof. Moreover, the inter-layer dielectric (ILD) layer 329 includes dielectric materials, for example, silicon oxide, silicon nitride or silicon oxynitride. The interconnect structure 330 can be formed by a deposition process and a patterning process, the descriptions thereof are not repeated herein.

Next, in some embodiments, the first metal block 319a is electrically connected to the second metal block 319b by the interconnect structure 330, and the third metal block 319c is electrically connected to the fourth metal block 319d by the interconnect structure 330. In other embodiments, the second metal block 319b may be electrically connected to the third metal block 319c by the interconnect structure 330.

In some embodiments, the external electrical signals are transmitted to the second metal block 319b through the interconnect structure 330, and the external electrical signals are then transmitted to the first metal block 319a and the first high-voltage element 200a from the second metal block 319b through the interconnect structure 330. Similarly, the external electrical signals are transmitted to the third metal block 319c through the interconnect structure 330, and the external electrical signals are then transmitted to the fourth metal block 319d and the second high-voltage element 200b from the third metal block 319c through the interconnect structure 330. The distance between any two of the adjacent metal blocks on the semiconductor substrate 101 and the isolation block 111 are large enough (for example, the distance between the second metal block 319b and the third metal block 319c are large enough), that is, two adjacent metal blocks are separated by an isolation block that is large and thick enough. Therefore, some embodiments of the disclosure can successfully transmit the electrical signals from an integrated circuit (IC) to another integrated circuit under the circumstance of being applied by a high voltage.

Some embodiments of the disclosure form a plurality of trenches and a plurality of strip structures which are parallel to each other and staggered arranged in the semiconductor substrate by an etching process. Then, by performing a thermal oxidation process, the strip structures are oxidized to form a plurality of oxidized portions, and the oxidized portions are connected to each other and filled up the trenches, thereby an isolation block is formed in the semiconductor substrate. Since the stress is evenly distributed in the isolation block, the problem of wafer warpage caused by uneven stress distribution can be prevented.

In addition, some embodiments of the disclosure efficiently form an isolation block covers a wide range of areas in the semiconductor substrate by etching and thermal oxidation processes, so that the circuit arrangement of the high-voltage elements can be more flexible. For example, the isolators between two high-voltage elements for transmitting electrical signals have been configured vertically. The isolators are adjusted to be configured horizontally and concentrated in a bulk high-voltage isolation block according to some embodiments of the disclosure. Furthermore, some embodiments of the disclosure can effectively reduce the cost of processing the semiconductor devices.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming an isolation block of a semiconductor device, comprising:
   providing a semiconductor substrate;
   performing an etching process to form a plurality of trenches which are parallel to each other in the semiconductor substrate, wherein a plurality of strip structures are between the trenches, the strip structures and the trenches occupy a first region in the semiconductor substrate, and the strip structures are arranged staggered with the trenches;
   forming a shielding layer on the semiconductor substrate after the formation of the plurality of trenches, wherein the first region is exposed by an opening of the shielding layer; and
   performing a thermal oxidation process, such that the strip structures are oxidized to form a plurality of oxidized portions, wherein the oxidized portions extend into the trenches and are connected to each other to form an isolation block in the semiconductor substrate.

2. The method as claimed in claim 1, wherein the isolation block has an area which is greater than that of the first region.

3. The method as claimed in claim 1, wherein one of the oxidized portions has a volume which is more than twice that of one of the strip structures.

4. The method as claimed in claim 1, wherein the thermal oxidation process is performed to oxidize sidewalls of the semiconductor substrate and bottom portions of the trenches.

5. The method as claimed in claim 1, wherein the isolation block has a top surface which is higher than that of the semiconductor substrate.

6. The method as claimed in claim 1, wherein one of the trenches has a width which is equal to that of one of the strip structures.

7. The method as claimed in claim 1, wherein an area exposed by the opening of the shielding layer is greater than that of the first region.

8. The method as claimed in claim 1, wherein the isolation block has a void therein.

9. The method as claimed in claim 8, further comprising:
   forming an oxidized layer on the isolation block, wherein the void is extended to the top surface of the isolation block, and the void is sealed by the oxidized layer; and
   performing a planarization process on the oxidized layer, and the void is not exposed by the planarization process.

10. The method as claimed in claim 1, wherein in a top view, the entirety of the first region is within the opening of the shielding layer.

11. A method for forming a semiconductor device having a high-voltage isolation block, comprising:
    providing a semiconductor substrate;
    forming a high-voltage isolation block in the semiconductor substrate;
    forming a first metal block and a fourth metal block on the semiconductor substrate, wherein the first metal block is a conductive pad of a first high-voltage element, and the fourth metal block is a conductive pad of a second high-voltage element;
    forming a second metal block and a third metal block on the high-voltage isolation block, wherein the first metal block, the second metal block, the third metal block and the fourth metal block are formed by the same metal layer; and
    forming an interconnect structure on the first metal block, the second metal block, the third metal block and the fourth metal block, wherein the first metal block is electrically connected to the second metal block by the interconnect structure, and the third metal block is electrically connected to the fourth metal block by the interconnect structure.

12. The method as claimed in claim 11, wherein forming the high-voltage isolation block comprises:
    performing an etching process to form a plurality of trenches which are parallel to each other in the semiconductor substrate, wherein a plurality of strip structures are between the trenches, the strip structures and the trenches occupy a first region in the semiconductor substrate, and the strip structures are arranged staggered with the trenches; and
    performing a thermal oxidation process, such that the strip structures are oxidized to form a plurality of oxidized portions, wherein the oxidized portions extend into the trenches and are connected to each other to form the high-voltage isolation block in the semiconductor substrate.

13. The method as claimed in claim 12, wherein the high-voltage isolation block has an area which is greater than that of the first region.

14. The method as claimed in claim 12, wherein one of the trenches has a width which is equal to that of one of the strip structures.

15. The method as claimed in claim 12, wherein one of the oxidized portions has a volume which is more than twice that of one of the strip structures.

16. The method as claimed in claim 11, wherein the high-voltage isolation block has a void therein.

17. The method as claimed in claim 11, wherein the high-voltage isolation block has no conductive portions therein.

* * * * *